United States Patent [19]
Milinkovic et al.

[11] Patent Number: 5,470,651
[45] Date of Patent: Nov. 28, 1995

[54] MANDREL FOR USE IN NICKEL VAPOR DEPOSITION PROCESSES AND NICKEL MOLDS MADE THEREFORM

[75] Inventors: Miroslav Milinkovic, Islington; Tony P. Mathews, Toronto; Kenneth C. Davy, Brampton, all of Canada

[73] Assignee: Mirotech, Inc., Weston, Canada

[21] Appl. No.: 933,660

[22] Filed: Aug. 24, 1992

[51] Int. Cl.$^6$ ................................ B32B 18/00
[52] U.S. Cl. .................. 428/325; 428/34.6; 428/34.7; 428/36.91; 428/329; 428/413; 428/417; 428/418; 428/430; 428/433; 428/435; 428/436; 428/446; 428/450; 428/451; 428/458; 428/461; 428/689; 428/702; 492/53; 492/59; 106/38.2; 106/38.3; 106/38.35; 106/38.9
[58] Field of Search ................... 428/457, 458, 428/461, 688, 689, 702, 325, 329, 34.6, 34.7, 36.91; 164/159, 45, 46, 228; 492/58, 59, 54, 53; 106/38.2, 38.22, 38.3, 38.35, 38.9

[56] References Cited

U.S. PATENT DOCUMENTS

| | | | |
|---|---|---|---|
| 2,632,234 | 3/1946 | Fitz | 492/58 |
| 3,111,731 | 11/1963 | Breining et al. | 164/46 |
| 3,158,499 | 11/1964 | Jenkin | 427/600 |
| 3,175,259 | 3/1965 | Breining | 164/45 |
| 3,355,318 | 11/1967 | Jenkin | 427/252 |
| 3,638,299 | 2/1972 | Garner et al. | 29/527.2 |
| 3,784,451 | 1/1974 | Garner | 204/20 |
| 4,233,076 | 11/1980 | Blanc | 106/38.3 |
| 4,316,498 | 2/1982 | Horton | 106/38.9 |
| 4,438,063 | 3/1984 | Suguri | 492/59 |
| 4,727,740 | 3/1988 | Yabuki | 492/54 |
| 4,780,141 | 10/1988 | Double | 106/38.3 |
| 5,188,791 | 2/1993 | Thiery | 106/38.3 |
| 5,221,336 | 6/1993 | Horton | 106/38.2 |
| 5,225,007 | 7/1993 | Hattori | 492/59 |
| 5,226,470 | 7/1993 | Lemoine | 106/38.9 |

OTHER PUBLICATIONS

Product Data Sheet—"MICRO PREG 376 CBN –FZ"—Advanced Polymer Industries, Inc. Plymouth, Mich. 48170.
Product Data Sheet—"COMTEK 66" Tooling compounds—CEMCOM Corporation, 1919, Halethorpe Farms, Baltimore, Md. 21227.
Technical Data Bulletin—"EPOLITE 1357" epoxy system –HEXCEL, 20701 Nordhoff Street, P.O. Box 2197, Chatsworth, Calif. 91311.
"EPIC LAM L–9000", Taninating System—General Fiberglass Supply, Inc., 1415–21 Ellis Street, Waukesha, Wis. 53186.
"CGL 1320–" Surface Coat; CIBA–GEIGY Canada Ltd., 7030 Century Avenue, Mississauga, Ontario, L5N 2W5.
"AKACAST 2319" Resin, Akemi Plastics, Inc. 5265 S. Clinton Trail, Eaton Rapids, Mich. 48827.

Primary Examiner—Ellis P. Robinson
Assistant Examiner—Timothy M. Speer
Attorney, Agent, or Firm—Cushman Darby & Cushman

[57] ABSTRACT

Mandrels for use in the manufacture of nickel shells by vapour deposition of nickel from gaseous nickel carbonyl. The mandrels comprise a body formed of a composite material of a matrix, for example, a ceramic material or an organic polymeric compound, and a filler, for example, metal, metal oxides, carbon in particulate form and having the same coefficient of thermal expansion as nickel. The invention includes processes of manufacturing the shells using the composite mandrel and shells made thereby. The shells have improved non-deformability in operation and are of use as molds in the mass production of plastic articles.

8 Claims, 4 Drawing Sheets

MANDREL FOR USE IN NICKEL VAPOR DEPOSITION PROCESSES AND NICKEL MOLDS MADE THEREFORM

FIELD OF THE INVENTION

This invention relates to chemical vapor deposition processes, particularly to nickel carbonyl vapor deposition and more particularly to novel mandrels of use in the manufacture of nickel shells and molds.

BACKGROUND TO THE INVENTION

Chemical vapor deposition is a well-known method for depositing films or coatings on substrates. One known chemical vapor used for depositing a nickel film or coating on a substrate is nickel carbonyl. Typically, the substrates are heated within a deposition chamber to a predetermined suitable reaction temperature, typically 110° C.–180° C. in an atmosphere of nickel carbonyl, $Ni(CO)_4$. The nickel carbonyl reacts at the surface of the heated substrate to deposit the Ni film or coating thereon.

The nickel carbonyl vapor is continuously introduced to the deposition chamber and gaseous reaction byproduct, carbon monoxide, is continuously purged from the deposition chamber in order to maintain proper circulation of reactive nickel carbonyl across the surfaces of the substrates. The substrates may be heated according to well-known methods, such as heat conduction, radiation, inductance and the like.

It is known to manufacture molds or patterns wherein a metal negative of a mold model is prepared by deposition of the metal upon the mold model. The mold model is also known in the art as a mandrel. The mold model/mandrel may be formed of any suitable material such as rubber, metal, plastic, wood and the like. After building up the metal negative to a suitable thickness and strength the metal negative is separated from the mold model/mandrel. Such molds with one or more defining surfaces made from the metal negative are used extensively for the production of thermosetting or thermoplastic articles. The mold either contains or compresses the plastic into the required shape and curing/cooling of the resulting plastic part will retain the shape inherent in the surface of the mold cavity.

An alternative, typical method of manufacturing a mold involves casting a "splash" on a master model and fabricating a production mandrel from the splash. Nickel carbonyl vapor deposition on selected, desired surfaces of the mandrel in a nickel carbonyl vapor deposition chamber provides a nickel shell to which shell is added a backing frame and components to provide, typically, a finished half of the desired mold.

A further alternative method of manufacturing nickel shells known in the art is by the technique of electroforming, wherein nickel is electrolytically deposited on a substrate from a nickel salt solution.

One drawback of electroformed nickel shells and molds, in consequence of the fact that electroformed nickel contains relatively large amounts of sulphur, is that repairs or modifications to the shell or mold by means of welding cannot be performed readily. In contrast, nickel produced by vapor deposition is devoid of sulphur and is, thus, readily weldable.

It is known that both electroformed and vapor deposited nickel can provide mold tool faces with a harder than usual surface for wearability. However, when electroformed nickel is produced with a hard face, it is often done in two steps, viz, a hard skin of nickel alloy, usually nickel/cobalt, is deposited to a nominal thickness in a nickel alloy plating tank; and after the shell is removed from the alloy plating tank, the rear surface is activated to receive an additional nickel deposit and the shell is placed in a pure nickel plating tank to complete the balance of the thickness required. If the activation at the rear of the nickel alloy face is not 100% successful, then a delamination could occur at the interface between the two different hardness layers. This is difficult to inspect and the delamination may occur much later during tool operation. A further problem is that this nickel alloy face can also be very difficult to weld repair if needed.

In contrast, vapor deposited nickel shells are produced in a "one-step" vapor deposition process, wherein a varied nickel hardness is obtained by means of gradually changing the deposition process parameters over the deposition period. This negates the production of distinct layers of nickel subject to delamination.

A further major advantage of the nickel carbonyl vapor deposition process over the electroforming process is that the former can deposit nickel at a rate 5 to 20 times faster than the latter process, which results in a faster and more economical production of nickel shells. Most metal faced molds, used in the production of composite plastics products have several common features which have evolved over the years, namely, a nickel or spray metal face; locating pins or bushings; outer support frame—cast aluminum or fabricated steel; heating/cooling conduit—usually copper tubes located at the rear of the shell; ejector—pin bushings and gates and the like; and a cast backing of, usually, metal filled polymer Such support frames and backing components as part of the tool backing system are often added to the rear of the shell after the shell is removed from the shell-forming mandrel. This can cause several problems in that the support frame must be mechanically fastened to the rear of the shell and the shell must also be trimmed to size to match the support frame. Both of these steps can induce twists or warps in the shell. Further, since the shell is removed from the mandrel, an alternative method must be found to support the shell during the rear casting technique. Considerable distortion of the shell could otherwise result. Most tool backing systems have an inherent fault in that they are formed of materials that are not matched to the expansion of the metal shell during heat-up and cool down cycle. Most back-up systems have vastly higher thermal expansion characteristics than the metal tool face. This can result in premature failure of the tool due to cracking or delamination. Most backing systems also do not provide an adequate bond between the metal face and the backing material.

Prior art mandrels used with nickel carbonyl vapor deposition processes to produce nickel shells have suffered from several defects. Prior art mandrels are manufactured with a vastly different C.T.E. to nickel. It has been found that it is not advisable to attach metallic components such as metal bushings, sleeves or other fixtures to the mandrel prior to nickel deposition. Generally, such metallic components that are attached to the mandrel will not retain their absolute dimension in location from mandrel to nickel shell because of different thermal expansion characteristics of the mandrel material, metal components and nickel shell. As a result, a metal frame or box that is secured to the rear of a mandrel often distorts the mandrel. Further, it is generally not possible to utilize the mandrel as a support during the fabrication of the nickel shell rear backing after the shell has been formed on the mandrel because the shell must be removed from the mandrel. This is because at room temperature the nickel shell and mandrel have incurred a relative dimensional change. This dimensional change, is in proportion to the degree of thermal expansion difference between the mandrel and the nickel. This dimensional change may result in the nickel shell becoming "locked" on to the mandrel if there is a configuration which is conducive to such an effect, resulting in potential destruction of the mandrel or distortion of the shell after cooling.

Prior art mandrels are also known which are fabricated in the form of thin walled shells of laminated, filled, high temperature epoxy resins which were heated from the rear by an atomized spray of heat transfer fluid such as HTF 500™ (ethylene glycol based composition, Union Carbide). The thin walled shell requirement limits the mechanical strength inherent in the mandrels. Such mandrels often cracked or otherwise failed due to thermal stresses, alone, before successful deposition could occur. Further, use of the heat transfer fluid remains a potential source of contamination for the nickel carbonyl vapor deposition process since the presence of a fluid liquid or vapor often spoils a potentially good nickel vapor deposition deposit. In consequence, mandrel structural arrangements have to be subject to precautions to eliminate the chance of any liquid or vapor leaks through any gaskets or seals. It has been found that a major source of contamination was through the mandrel itself by virtue of its porosity to such fluid or vapor. As a result, sealants have to be applied to the rear surface of the mandrel to reduce such leakage. Such sealant application often unfavorably influences the thermal conductivity and does not ensure a leak proof structure.

The prior art considered to be the most relevant to the present invention is as follows. U.S. Pat. No. 3,355,318, issued Nov. 28, 1967—W. C. Jenkin and U.S. Pat. No. 3,158,499 issued Nov. 24, 1964—W. C. Jenkin describes nickel carbonyl deposition onto various non-composite substrates. U.S. Pat. No. 3,784,451 issued Jan. 8, 1974—P. J. Garner describes a metal faced mold with an electroplated spray metal face and a cast backing formed of cement, plaster of Paris or epoxy resin. U.S. Pat. No. 3,175,259 issued Mar. 30, 1965— E. R. Breining et al describes gas deposition using nickel carbonyl to produce molds or dies with the preferred substrate having a matching C.T.E. U.S. Pat. No. 3,111,731 issued Nov. 26, 1963—E. R. Breining et al, describes die construction with gas plating using nickel carbonyl with an internally heated mold having a matched C.T.E. with iron mandrel.

SUMMARY OF THE INVENTION

It is an object of this invention to provide a novel mandrel for use in the production of a nickel shell by vapor deposition having improved surface resolution and definition.

It is a further object of this invention to provide a novel mandrel of use in the manufacture of nickel molds having improved uniform nickel shell wall thickness and non-deformability in operation.

While the present invention is described and illustrated in the preparation of molds, foundry patterns and the like shapes, it will be obvious that other and various articles and shapes can be made by employing the same techniques as herein disclosed. The invention may thus be used in any instance where it is desirable to duplicate a shape by nickel carbonyl vapor deposition so as to obtain a self-supporting image of the shape.

These and other objects are achieved by providing a novel mandrel of use in the manufacture of nickel shells and nickel composite molds by the vapor deposition of nickel wherein the mandrel has essentially the same coefficient of thermal expansion (CTE) as that of vapor deposited nickel.

Accordingly, the invention in its broadest aspect provides a mandrel of use in the manufacture of a nickel shell by the vapor deposition of nickel from gaseous nickel carbonyl, said mandrel comprising a body formed of a composite material comprising a matrix and a filler and having essentially the same coefficient of thermal expansion as nickel.

By the term "mandrel" as used in this specification and claims is meant an object having a heated surface upon which nickel can be deposited by vapor deposition from nickel carbonyl and allowed to grow. By the term "composite material" is meant any material formed of matrix and filler substances so combined in admixture as to provide the mandrel essentially with the same coefficient of thermal expansion ($13.1 \times 10^{-6}$/mm/mm° C.) as that of nickel deposited by a vapor deposition process from nickel carbonyl.

Preferably, the composite material has a coefficient of thermal expansion selected between $10 \times 10^{-6}$ to $16 \times 10^{-6}$ /mm/mm/° C.

Examples of matrix materials of use in the practice of the invention are ceramic materials and organic polymeric material.

Examples of ceramic materials are quartz (crystalline silica) and amorphous silica, and chemically bonded ceramics such as cements, for example, portland cement. Organic polymeric material may be selected, for example, from the group of bismaleimide resins, epoxy and modified epoxy resins, phenolic resins, polyester resins, polyamide resins, vinylester resins and mixtures thereof.

Preferably, composite materials of use in the practice of the invention are set forth in TABLE 1.

TABLE 1

MATERIAL PROVIDING MATCHING COEFFICIENT OF THEMAL EXPANSION TO NICKEL SHELL

| Trademark | Composition | Supplier |
|---|---|---|
| COMTEK 66 Tooling compound | Cementitious of Composite a) Portland Cement b) Quartz (crystalline silica) c) amorphous silica and contains one or more of the following metals as powder, aluminum, chromium, copper, cobalt, zinc, iron, manganese, molybdenum and nickel. CTE $13.9 \times 10^{-6}$/mm/mm/°C. | CEMCOM Corporation 1919 Halethorpe Farms Road Baltimore, MD |
| MICRO PREG 376 CBN-FZ epoxy tooling compound | 35.7% W/W - Tetrafunctional glycidal ether resin. 2.3% W/W % - Poly substituted imidizoline blend; and 62% W/W% - Carbon Fibers CTE $10 \times 10^{-6}$ mm/mm/°C. | Advanced Polymer Industries, Inc. 40300 Plymouth Road Plymouth, MI 48170 |

| | % W/W | |
|---|---|---|
| AKACAST 2319 Resin and | Epoxy Resin Aliphatic | 10–15 1–5 | AKEMI PLASTICS INC. 5265 S. Clinton Trail Eaton Rapids, MI 48827 |

TABLE 1-continued

MATERIAL PROVIDING MATCHING COEFFICIENT OF THEMAL EXPANSION TO NICKEL SHELL

| Hardener | Epoxy resin | |
|---|---|---|
| | Diluent | 0–1 |
| | Proprietary Additive | 0–1 |
| | Air Release Additive | 0–1 |
| | Fumed Silica | 0–1 |
| | Aluminum oxide | 80–90 |
| | CTE 13.1 × 10$^{-6}$/mm/mm °C. | |

If necessary, in order to provide stability and the correct coefficient of thermal expansion to the formed mandrel, the composite material comprises a suitable particulate or fibrous filler or diluent, in predetermined amounts readily determined by simple experimentation. Examples of broad classes of fillers or diluents are metals, metal oxides, ceramics, glass and carbon in the form of powders, fibers and granules. The filler may, for example, be selected from the group consisting of fused and non-fused silica; CAB-O-SIL® silica; aluminum in the form of powder, beads or shot; powdered calcium carbonate; carbon black; milled or chopped carbon-fibers; milled or chopped fiberglass; solid or hollow glass spheres; metal in the form of flakes, shot or beads, milled or chopped aramid fibers and ceramic powders or fibers.

We have found that a preferred mandrel according to the invention has a surface coating of a coating material suitably retainable on the mandrel surface under nickel carbonyl deposition conditions and being acceptable to receive deposited nickel as to allow build-up of the deposited nickel to produce the nickel shell having well-defined surfaces complementary to that of the mandrel. Any suitable coating material satisfying the criteria outlined, hereinabove, may be used as part of the preferred mandrel. Preferably, the surface coating material is selected from resin compatible with or identical to the families of resins found under the organic polymeric materials useful as composite material substances named hereinbefore, namely, for example bismaleimide resin, epoxy resin, modified epoxy resin, phenolics, polyamines, polyesters, polymides, vinylesters.

More preferred surface coat materials of use in the practice of the invention are set forth in TABLE 2.

TABLE 2

SURFACE COAT MATERIALS

| Trademark | Chemical Composition | | % | Hardener | % | Supplier |
|---|---|---|---|---|---|---|
| EPOLITE | Resin | | | Hardener | | Hexcell Corporation |
| 1357 Resin and Hardener | Triglycidyl Ether of Trimethylolpropane | | 20–30 | Isophorone Diamine | 50–70 | 20701 Nordhoff St. Chatsworth, CA |
| | Tetraglycidal Ether of Methylene bisbenzedamine | | 30–40 | Diethyl Toluene Diamine | 30–40 | |
| | Insert Fillers Sodium Metasilicate filler Silicon Dioxide Powder CTE 36–45 × 10$^{-6}$/mm/mm/°C. | | 40–50 | Salicylic Acid | 5–10 | |
| EPIC LAM L-9000 | modified aliphatic Polyamine CTE 32.4 × 10$^{-6}$/mm/mm/°C. | | | Epichlorohydrin | | General Fiberglass Supply, Inc. 1415 - 21 Ellis Street Waukesha, Wisconsin 53186. |
| CGL 1320 epoxy surface coat | 1,4-Diglycidyloxybutane 10–20% glycidyl benzamine 30–50% carbon black fibre 30–70% | | | | | Ciba-Geigy |
| RP 1510 Hadener | i) 1.3 - benzene dimeltanamino as hardener (10–20%) ii) I-methyl imidazole iii) 1.3 Benzenedimethanamine, polymer with 2,2'-{(1-methyl ethylidene) bis(4,1-phenyleneoxymethylene)}bis{oxirane} and 2,2,4-trimethyl 1,6-hexane diamine CTE 29.8 × 10$^{-6}$/mm/mm/°C. | | | | | |

In a most preferred feature, the invention provides a mandrel as hereinbefore defined further comprising heat transfer conduit means as a means of internally heating the mandrel in a uniform manner. Such heat transfer conduit means comprises, for example, embedded metal heating tubes or embedded electrical heating elements so suitably spaced as to provide in operation a uniform surface temperature to the mandrel upon which nickel is to be deposited.

When such heat transfer conduit means and other components are formed of metal or other materials, such metals and materials, preferably, have essentially the same CTE as nickel.

In a further aspect, the invention provides a method of making a nickel composite mold tool comprising a nickel shell and metal backing components retained thereto for use in the manufacture of molded objects, said method comprising:

(a) positioning a mandrel as hereinabove defined within a vapor deposition chamber said mandrel having a nickel carbonyl vapor deposition surface to receive nickel carbonyl for deposition upon said surface;
(b) positioning said metal backing components adjacent said mandrel;
(c) feeding said nickel carbonyl to said surface to produce said nickel shell by vapor deposition;
(d) casting a suitable reinforcement backing into said nickel shell to produce said nickel composite mold; and
(e) removing said mold unit from said mandrel.

In a preferred, optional feature, the method comprises feeding said nickel carbonyl to said surface to produce said nickel shell and retain said metal backing components to said nickel shell.

In a more preferred feature, the methods as hereinbefore defined further comprise retaining said metal backing components and said nickel shell by casting means using a material having essentially the same coefficient of thermal expansion as vapor deposited nickel.

In a further aspect, the invention provides a nickel composite molding unit as produced by the methods as hereinabove defined.

The composite mandrel of the present invention allows for the manufacture, in the first instance, of an improved nickel shell and, in a second instance, an improved nickel composite mold.

The nickel shell is improved over prior art shells by having the desired uniform thickness, non-deformed shape and better defined surfaces. This improvement is seen by reason of the mandrel being formed of a composite material, at least adjacent the deposition surfaces, which thermally expands and contracts substantially to the same degree as vapor deposited nickel formed on the mandrel deposition surfaces. This mandrel material provides dimensional accuracy as between the mandrel and the shell.

Further, deposition of nickel on the mandrel to which a frame, heat transfer conduits, metallic components, fittings and the like of use in the resultant nickel composite mold, are already attached, followed by application of a rear, supportive composite backing resin and subsequent heat curing while on the mandrel provides the improved composite mold with improved dimensional acuity. By encapsulating the metal support frame within the deposition chamber during the vapor deposition cycle post operations of shell trimming and mechanical fastening of the shell to the support frame are eliminated. This also means that the shell can remain on the mandrel for the casting of the backing system. This is accomplished by the development and use of a mandrel material which has essentially a matched coefficient of thermal expansion to the nickel tool face. The mandrel therefore becomes the support for the casting of the backing system. This results in a tool with minimal distortion.

The preferred backing system of the composite mold tool has essentially a matched CTE to the nickel tool face. The backing system also closely matches the CTE of the steel components. This eliminates any unwanted stresses induced during heat-up or cool down of the tool during the manufacture of plastics products. The backing system also has an excellent bond to the nickel face. Additional mechanical fasteners are provided to produce an improved bond between the nickel face and backing. This minimizes shell/backing delamination. Distortions of the nickel shell of the composite mold tool by the frame, backing components and backing material during plastic product manufacture is minimized.

The cured composite material of the mandrel, preferably, should not be nickel carbonyl absorbent, nor be so porous as to allow the passage of vapor or liquids through the body of the mandrel or adjacent the mandrel deposition surface, nor allow "outgassing", i.e. release of volatile or gaseous substances which may hinder vapor deposition. More preferably, the mandrel has a surface coat, as hereinbefore defined which also is not nickel carbonyl absorbent nor allows "out-gassing".

Clearly the coating surface material when disposed on the mandrel surface should be such as to provide the nickel shell with adequate complementary definition as to provide resultant plastic products with the same adequate definition as the mandrel surface.

In the preparation of the mandrels according to the invention, a suitable master model is generally prepared. This master model can be made of any suitable master model fabricating material known in the art such as, wood, cast epoxy resins, syntactic epoxy foams, metals, polyurethane foams, plasters, clays and the like. The model is, typically, lubricated with a release agent/film in order to facilitate removal of the manufactured mandrel from the model after casting. This release agent can be any non-transferring commercial release agent that does not contain any silicones, natural or synthetic waxes. Examples of suitable release agent materials include "FREKOTE 700"™, "MONOCOAT E179"™ and "RP79-1"™. The release agent is allowed to dry for a minimum of, generally, 24 hours at 24° C. Shorter drying times of 2–3 hours may be used at elevated temperatures (e.g. 70° C.) provided the master model is fabricated from a material which can withstand this temperature without destruction or distortion.

The master model is now coated with a suitable surface coat of a high temperature resistant polymer that will facilitate transfer of all fine surface details from the model to the mandrel surface and prevent surface marking which may occur on the mandrel due to high filler content in the composite materials of the mandrel body. Preferred materials for the surface coat are room-temperature curing, high temperature resistant, filled thermosetting polymers.

The surface coat may preferably be 1320™ carbon fiber filled, modified epoxy resin (Ciba-Geigy). Preformed copper heating tubes and thermocouples are suitably located adjacent the appropriate surface of the yet to be formed mandrel. The heating tubes are spaced as per the requirement for uniform surface temperature during the heating phase. Typical spacings are 5 cm center to center and 2 cm from the surface. The preferred tubing is 1 cm diameter, seamless, thin-walled copper tubing.

A metal frame or box may be placed on the master model to contain the mandrel casting composite material during construction, to provide reinforcement to the mandrel during its heat cycles and to further provide protection to the mandrel during shipping.

In addition to the heat transfer tubing, other metal inserts, webs, bushings, pins which are to be integral with the formed mandrel may be attached to the master model.

A mixture of thermosetting resins with suitable fillers to provide the coefficient of thermal expansion as that, essentially, of vapor deposited nickel (13.1 ×10$^{-6}$/mm/mm ° C.) is poured into the frame, onto the surface coat and around the components and heating tubes within the frame. The surface coat and composite backing are subjected to vibration with the aid of an electric or pneumatic vibration device for 2–4 hours and allowed to cure at 24° C. for 48–72 hours. The mandrel is subsequently removed from the master model, generally, with the aid of plastic wedges and heat-cured in accordance with the schedule for the mass cast resin composite material used.

In an alternative method of making a mandrel of the present invention, a polystyrene or other foam master model is assembled which roughly corresponds to the dimensions of the required part. The model is sized so as to allow for machining of the final mandrel to exact size. After preparation of the foam model, a metal frame or box is placed on the model and preformed copper heating tubes or other heat transfer conduit tubes are placed adjacent to the model surface as hereinbefore described.

A room temperature curing, metal-filled, Chemically Bonded Ceramic (CBC) with matched CTE to nickel is mixed and prepared. This material, machinable upon cure with conventional equipment, is allowed to cure @24° C. for 24 hours. The mandrel base is then removed from the temporary foam master mold and placed in a steam autoclave to hydro-mineralize the CBC. After an autoclave processing at 132°–150° C. for 24 hours the mandrel is dehydrated in a convection oven to a maximum temperature of 230° C. for 12 to 15 hours. The mandrel is allowed to cool to room temperature. The mandrel face is now ready for machining by standard milling equipment. After machining, the mandrel face is, preferably, sprayed or coated with high temperature 1320™ carbon-fiber filled epoxy surface coat thermosetting resin (Ciba-Geigy) to a thickness of 10 to 15 mils. The surface coat is allowed to cure @24° C. for 48 hrs and, subsequently, hand polished to a desired surface finish. When hand finishing is complete, the surface coat is, typically, cleaned with a suitable solvent such as 1,1,1, trichloroethane. The mandrel is now, generally, heat cured to about 205° C. and held at that temperature for a minimum of 6 to 8 hours and subsequently allowed to cool to room temperature.

In a further alternative method of making a mandrel of the present invention, a suitable master model is prepared formed of a model fabricating material as is known in the art, for example, wood, cast epoxy resins, syntactic epoxy foam, urethane foam and lubricated with FREKOTE 700, release agent, in order to facilitate removal of the mandrel from the model after production. This release agent can be any non-transferring commercial release agent except that it should not contain any silicones or any natural or synthetic waxes. Examples of other suitable materials would include MONOCOAT E179, and RP79-1. The release agent is allowed to dry for a minimum of 24 hours @ 24° C., however 2 or 3 hours can be used with an elevated temperature (e.g.: 70° C.) as long as the master model is fabricated from a material which can withstand this temperature without distortion.

A metal frame or box is placed on the model to contain the mandrel casting materials during construction and to further provide protection to the mandrel during shipping. At this time any metal inserts, webs, bushings, pins or other items which are to become an integral part of the mandrel are attached to the master model.

The master model is now coated with a suitable surface-coat. This is of a high temperature resistant polymer that facilitates transfer of all fine surface details from the model and prevents any surface marking which may occur due to the high filler content in the rear support material. The preferred material for a surface coat is, thus, a room-temperature curing, high temperature resistant, filled thermosetting polymer. The surface coat may preferably be 1320™ carbon fiber filled modified Epoxy resin. The surface coat is allowed to gel to a firm tacky stage (finger prints will be just left in the surface if pressed firmly). This will take from between 4 to 8 hours @24° C.

A frozen mixture of a thermosetting resin with a suitable filler having essentially the same CTE as nickel is cured to a "B" or semi stage in the form of sheets of a minimum thickness of 6.5mm and frozen (@ 0° C. or colder) to prevent further curing. The sheets are removed from the freezer and allowed to thaw to room temperature (5 to 20 minutes). The sheets are then placed onto the tacky surface coat and hand kneaded and shaped to fit. A thickness of 6.5 mm min. is required. Preformed copper heating tubes and thermocouple ports are placed over the surface and pressed into the unfrozen backing sheet. Heating tubes are spaced as per the requirement of uniform surface temperature during the heating phase. Typical spacings are 5 cm center to center. The preferred tubing is 1 cm diameter seamless thin walled copper tubing. 1 cm thick unfrozen backing sheets are now cut into strips so as to fit in between the copper tubing. An additional layer of unfrozen backing 6.5 mm to 13 mm thick is now placed over the rear of the tubes and kneaded and shaped to fit. A vacuum bag is placed over the rear surface and sealed to the perimeter of the mandrel. The bag materials and breathers are used as per standard practice in the art. A vacuum of 73 cm hg minimum is pulled and the surface coat/unfrozen backing is allowed to cure at room temperature for 72 hours. The mandrel is removed from the master model with the aid of plastic wedges and heat cured as per the schedule for the frozen backing system.

DESCRIPTION OF THE PREFERRED EMBODIMENTS

In the order that the invention may be better understood, preferred embodiments will now be described by way of example only with reference to the accompanying drawings wherein FIG. 1 represents a diagrammatic cross-sectional view of a prior art master/model;

The following process describes the production of a nickel vapor deposition mandrel according to the invention comprising a filled thermosetting resin body having the same coefficient of thermal expansion as that of deposited nickel, a high temperature, filled thermosetting resin surface coat on the mandrel body and having heat transfer conduit means suitably embedded in the mandrel body.

Figure 1:
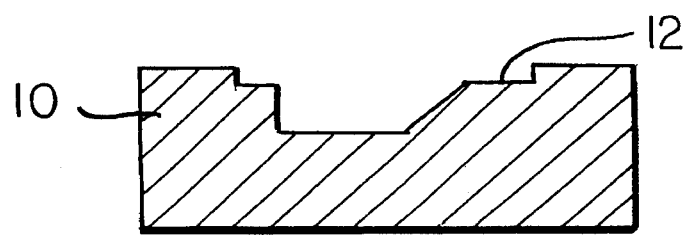
Figure 2:
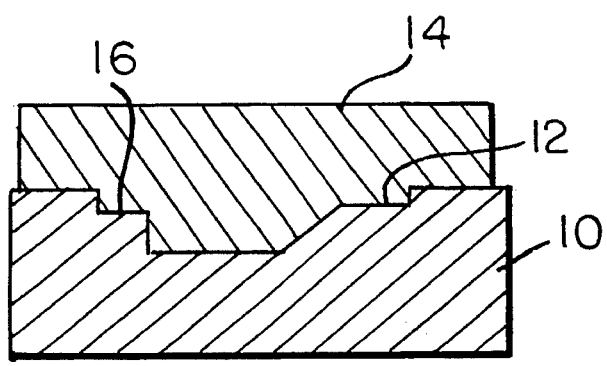
FIG. 2 represents a diagrammatic cross-sectional view of the master/model of FIG. 1 and a cast composite mandrel according to the invention.

With reference to the drawings, FIG. 1 shows a master model 10 formed of a syntactic foam and originally lubricated with a releasing agent, RP79-1 12. FIG. 2 shows a mandrel 14 formed of a cured, mass casting filled thermosetting resin, AKACAST 2319™ alumina-filled modified epoxy resin (AKEMI), in admixture with a removable wood filler to reduce the mass of casting resin to minimize heat-up time and having a coefficient of thermal expansion of $13.1 \times 10^{-6}$ /mm/mm° C. Mandrel 14 has a surface coat 16 of high temperature resistant polymer 1320™ carbon fiber filled modified epoxy resin (Ciba-Geigy) and a deposition frame (not shown). Disposed within mandrel 14, adjacent surface coat 16 are preformed copper heating tubes (not shown) and thermocouple ports (not shown) cast into the mandrel. The casting resin is allowed to cure for about 3 days at ambient temperature prior to separation of the mandrel from master model 10. Mandrel 14 is subsequently separated from mold 10 and placed in a forced air convection oven and heat-cured so as to minimize distortion. A typical heat-cure would be to heat mandrel 14 at a heat-up rate of 10° C./hr to 50° C. held at 50° C. for 2 hours, heated to 88° C. at the same heat-up rate and held for 2 hours, and subsequently heated at the same heat-up rate and held at that temperature for 2 hours where the temperature is systematically taken from 88° C. to 150° C. to 177° C. and finally 204° C. and held thereat for 6 to 8 hours. Subsequently, mandrel 14 is cooled down at a rate similar to the heat-up rate (i.e. 10°–20° C./hr). All temperatures are measured by means of the thermocouples installed into the thermocouple ports.

Figure 3:
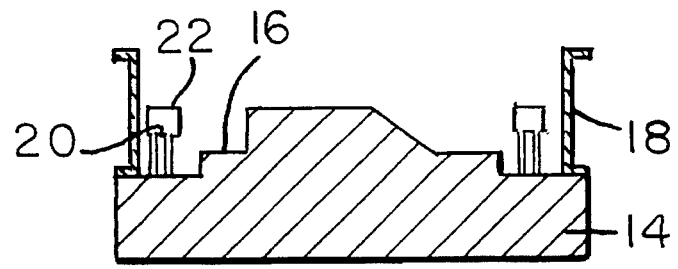
FIG. 3 represents a diagrammatic cross-sectional view of the mandrel of FIG. 2, inverted and with attached components.

With reference now to FIG. 3 which shows mandrel 14 in an inverted position from that shown in FIG. 2. Mandrel 14 has a steel frame 18 at the perimeter of a top surface 16 of mandrel 14. Frame 18 becomes an integral part of the nickel shell subsequently manufactured by nickel vapor deposition by means of composite mandrel 14. Frame 18 adds strength to the final composite mold and allows attachment of mold components, such as lifting eyes, locating pins, bushings and the like. A suitable anchoring groove (not shown) is machined on the inside face of frame 18 to aid in anchoring frame 18 to the subsequently formed nickel shell. The coefficient of thermal expansion of the main body of mandrel 14 is similar to that of steel of frame 18, which allows the steel frame 18 to be firmly anchored to mandrel 14 during the nickel carbonyl deposition process while ensuring good thermal contact and dimensional fidelity. Steel frame 18 is anchored by means of bolts (not shown) threaded into mandrel body 14. In an alternative embodiment, threaded metal inserts (not shown) may be cast into mandrel body 14 to obviate the need for any additional machining of mandrel 14.

Anchored to the face of mandrel 14 are metal bushings 22 of use in accommodating ejector pins in the nickel composite mold. Again, the closely matched coefficient of thermal expansion of mandrel 14 with steel allows metal components 22 to be incorporated into the nickel shell product without relative dimensional changes upon thermal cycling. Components 22 are firmly bolted to mandrel body 14 to ensure good thermal contact.

Protective metal tubes (not shown) cover metal components 20 during nickel carbonyl vapor deposition to prevent deposition of nickel on anchoring bolts 20 and also to provide apertures to receive the rear casting support to be eventually added to the rear of the nickel shell mold to constitute the nickel composite mold.

Figure 4:
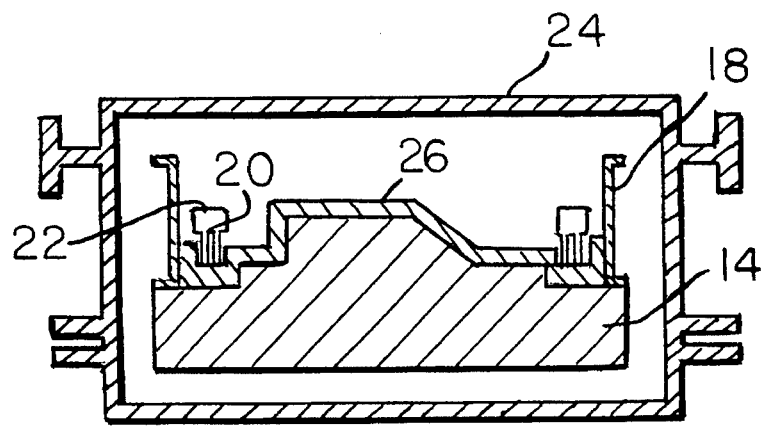
FIG. 4 represents a diagrammatic cross-sectional view of the mandrel and components of FIG. 3, after nickel deposition, within a deposition chamber.

With reference to FIG. 4, mandrel 14 is transferred to the nickel carbonyl vapor deposition chamber 24 wherein a pure nickel layer is deposited to a thickness that is suitable for the final nickel shell composite mold. Typical nickel thicknesses are 3 mm to 6 mm nominal. During the deposition process, mandrel 14 is heated to a nominal surface temperature selected from 165° C. to 188° C. The temperature is monitored by means of the thermo-couples in mandrel 14.

Figure 5:
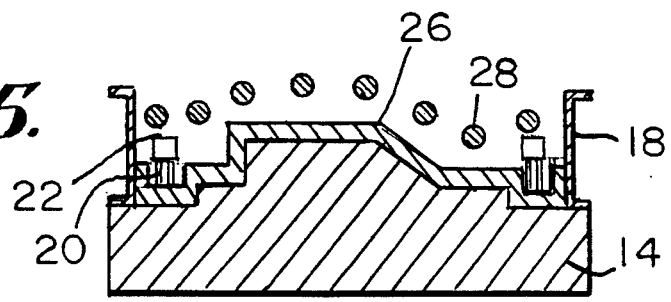
FIG. 5 represents a diagrammatic cross-sectional view of the mandrel and nickel shell of FIG. 4 removed from deposition chamber.
Figure 6:
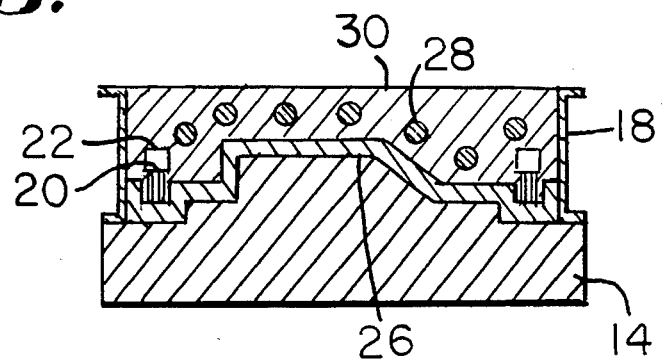
FIG. 6 represents a diagrammatic cross-sectional view of the mandrel, shell of FIG. 5 having a cast composite material backing according to the invention.
Figure 7:
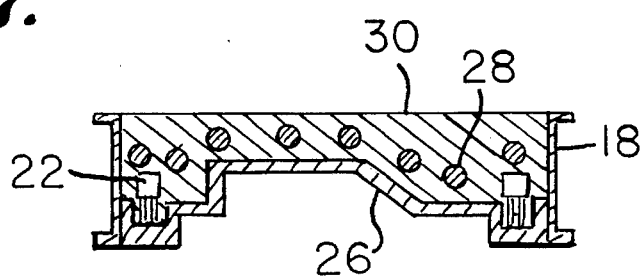
FIG. 7 represents a diagrammatic cross-sectional view of the shell, and composite material backing of FIG. 6 removed from the mandrel.

After nickel carbonyl vapor deposition, FIG. 5, nickel shell 26 and mandrel 14 are allowed to cool down and the rear surface of the nickel shell 26 is thoroughly cleaned with a solvent such as 1-1-1-trichloroethane and roughened by sandblasting or equivalent to ensure a good bond between the nickel shell and subsequently applied casting resin. Studs may also be welded to the back of the nickel shell which aid in securing the backing material by the process of mechanical interlocking of the mass casting material and the threads and nuts which are on the studs (not shown). Heating or cooling tubes 28 are disposed in the void created by shell 26 and frame 18, FIG. 6. Casting material 2319™ composition 30 is poured within frame 18 and allowed to cool for 3 days at 24° C. followed by a final oven-heat cure as described in the preparation of the composite mandrel 14. It is important to note the critical feature of shell 26 being still attached to mandrel 14 while the casting resin is heat-cured. Since the backing casting material 30 has an essentially matched coefficient of thermal expansion to nickel, this ensures good thermal stability of the final nickel composite mold. After heat-curing, mandrel 14 and the shell with composite backing 30 are cooled to ambient temperature and the shell with composite backing 30 is removed from mandrel 14 to give a warp-free, rugged nickel faced composite mold half, FIG. 7.

Figure 8:
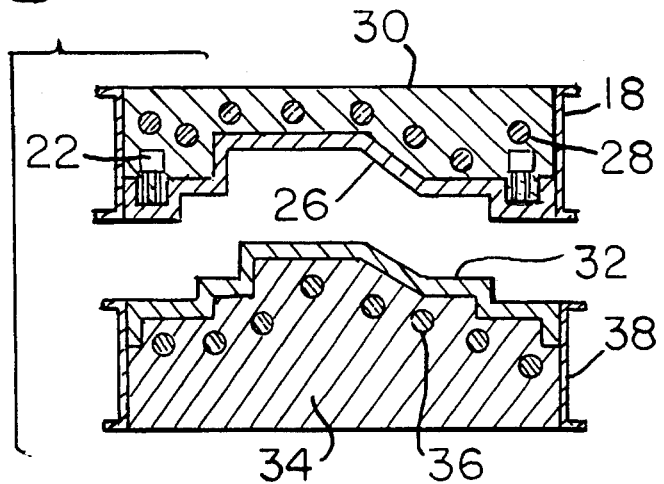
FIG. 8 represents a diagrammatic cross-sectional view of a pair of complementary half molds according to the invention.

FIG. 8 shows a second nickel face composite mold half consisting of a nickel shell 32, frame 38, composite backing 34 & heating or cooling tubes 36 produced by the same process and these two halves together form a complete mold suitable for a variety of plastic forming processes.

EXAMPLES

Mandrels according to the invention were manufactured as herein before described and having the compositions as follows wherein the trademarks denote the resins and hardeners hereinbefore defined.

|  | w/w |
|---|---|
| Example 1 | |
| BODY | |
| AKACAST 2319 (AKEMI) RESIN | 76.0% |
| HARDENER | 7.5% |
| TABULAR ALUMINA (COARSE) | 7.5% |
| TABULAR ALUMINA (FINE) | 7.5% |
| CHOPPED GLASS (½" FIBRES) | 1.5% |
| | 100.0% |
| Resultant CTE = 13. 1 × 10⁻⁶/mm/mm/°C. SURFACE COAT THICKNESS FROM 0.4 mm–0.8 mm | |
| CGL 1320 (CIBA-GEIGY) RESIN | 93.6% |
| HARDENER | 7.4% |
| | 100% |
| EXAMPLE 2 | |
| BODY | 100% |
| COMTEK 66 (CEMCON) RESIN HARDENER FILLER SURFACE COAT THICKNESS FROM 0.4 mm–0.8 mm | |
| CGL 1320 (CIBA-GEIGY) RESIN | 93.6% |
| HARDENER | 7.4% |
| | 100% |
| Resultant CTE = 13.86 × 10⁻⁶/mm/mm/°C. EXAMPLE 3 | |
| BODY | |
| MICRO PREG 376 CBN-FZ (ADVANCED POLYMER INDUSTRIES) | |
| 6.35 mm sheet | 25% |
| 9.5 mm sheet | 75% |
| | 100% |
| SURFACE COAT THICKNESS FROM 0.4 mm–0.8 mm | |
| CGL 1320 (CIBA-GEIGY) RESIN | 93.6% |
| HARDENER | 7.4% |
| | 100% |
| Resultant CTE = 10.1 × 10⁻⁶/mm/mm/°C. | |

Measuring Coefficient of Thermal Expansion (C.T.E.) in Composite Materials for

Nickel Vapor Deposition. Applications

Figure 9:
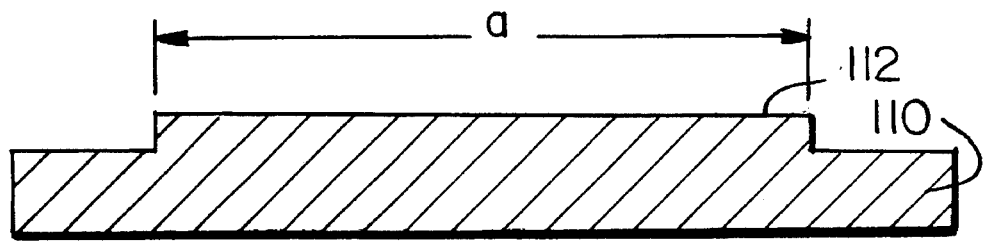
FIG. 9 represents a cross-sectional view of an aluminum test bar for determining the CTE of the composite materials of use in the present invention.

The method of determining C.T.E. of a composite mandrel body material for nickel carbonyl vapor deposition applications is as follows:

An Aluminum test bar 110 (10 cm×20 cm×2 cm) is fabricated as having the cross-section as shown in FIG. 9. A pair of vertical steps are machined into the bar at a predetermined distance apart (distance a). The distance is checked at room temperature (24° C.) using a co-ordinate measuring machine (C.M.M.) (not shown) capable of measuring to an accuracy of ±0.005 mm. Aluminum bar 110 is coated with a release agent 112 selected for compatibility to the nickel carbonyl vapor deposition process and in an amount sufficient only to just allow easy release of a cast composite resin from the aluminum bar.

Figure 10:
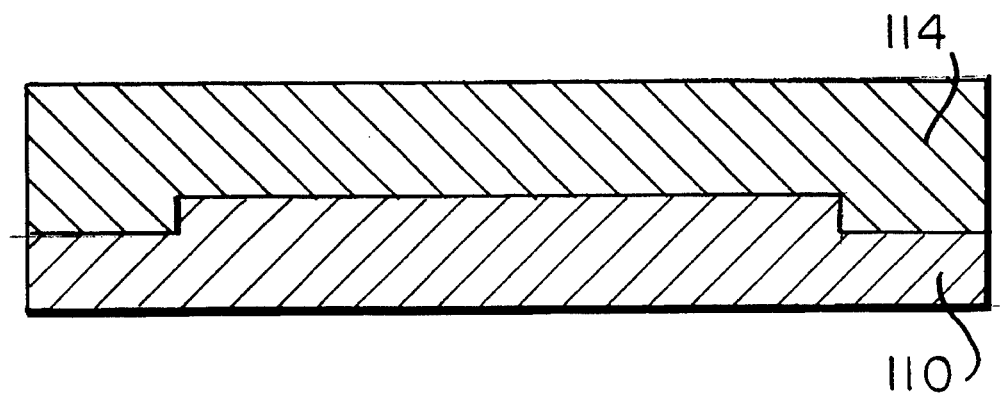
FIG. 10 represents a cross-sectional view of the test bar of FIG. 9 with a cast composite resin mandrel according to the present invention.

Reference to FIG. 10 shows a measured quantity of candidate composite resin with the desired complementary filler which is prepared and mixed. The resin is cast onto aluminum bar 110 to a thickness of ca. 15 mm nominal 114. A type J thermocouple (not shown) is cast into the resin in the middle of bar at 2.5 mm above the face of bar 110. All casting is done at room temperature (24° C.).

Composite resin 114 is allowed to cure at room temperature for a minimum of 72 hours. When cured the rear surface of casting 114 is machined (milled) to a thickness of 1.2 cm nominal. Casting 114 is carefully removed from aluminum bar 110 and placed on a flat, ground, stress-relieved, steel plate, (not shown) 2.5 cm minimum, which are then placed in a convection oven (not shown) and heat cured as per the requirements of the specific resin by monitoring the temperature with the cast-in internal thermocouple.

Figure 11:
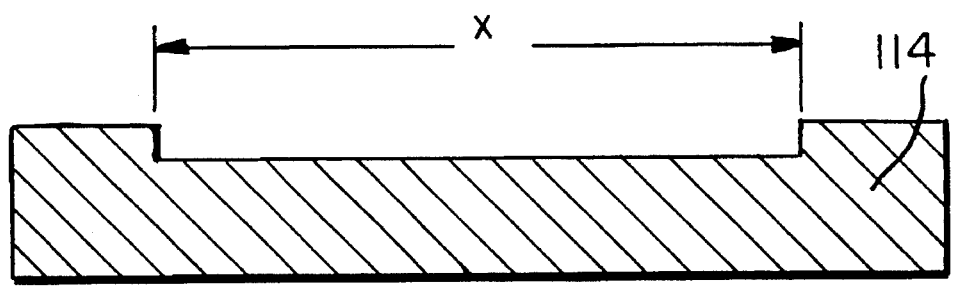
FIG. 11 represents the cast composite resin mandrel of FIG. 10 in inverted form to that shown in FIG. 10, in the absence of the aluminum test bar.

With reference to FIG. 11, when heat curing is complete resin 114 and plate 110 are allowed to cool to room temperature. At this point the distance between the steps is measured (distance x), using the CMM and compared to the original aluminum bar 110 (distance a vs. distance x). Any difference in length is noted and is indicative of shrinkage in the resin upon cure.

Shaped cured resin 114, now deemed a mandrel, is cleaned by a suitable solvent and alkaline solution, rinsed with de-ionized water, and dried with clean, filtered pressurized nitrogen ($N_2$). Mandrel 114 is now transferred to a nickel carbonyl vapor deposition chamber (not shown) and heated by means of conduction heating with an electrical "hot-plate" (not shown) at a nominal surface temperature of 177° C. measured by means of the internal thermocouple.

Figure 12:
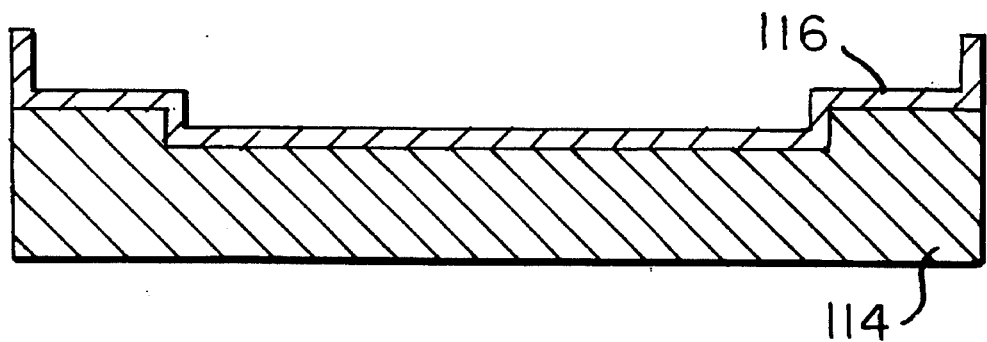
FIG. 12 represents the mandrel of FIG. 11 provided with a nickel shell.

With reference to FIG. 12, a nickel shell 116 is formed to a nominal thickness of 2.5 mm. After deposition the mandrel shell combination is allowed to cool to room temperature and nickel shell 116 is carefully removed from mandrel 114.

Figure 13:
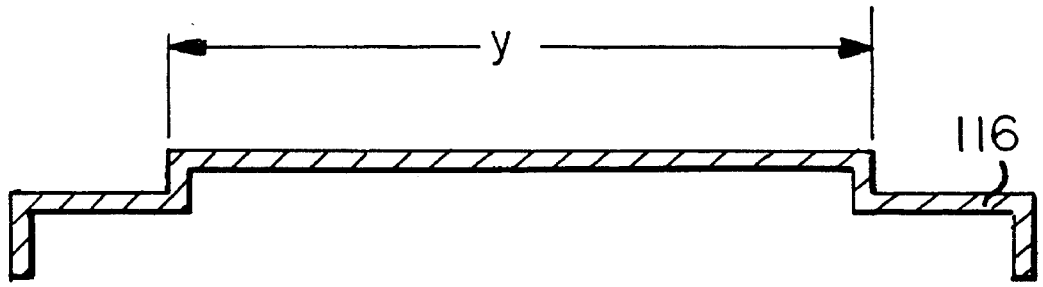
FIG. 13 represents the inverted nickel shell of FIG. 12 in the absence of the mandrel.

With reference to FIG. 13, the resulting set of steps in regards shell 116 is now measured with the CMM and the resulting dimension compared to the mandrel at room temperature (24° C.).

The resulting C.T.E. for the composite resin is determined using the following formula:

$$CTE_x = CTE_y + \frac{y-x}{(T_d - T_a) * x}$$

Where $T_d$=the temperature at which deposition occurred;

$T_a$=the temperature at which all measurements were taken (usually ambient);

$CTE_x$=the CTE of the resin investigated;

$CTE_y$=the CTE of NVD Nickel (7.2×10⁻⁶/in/in/° F. or 13.1×10⁻⁶/mm/mm/° C.);

x=the measurement across the steps of the composite resin; and y=the measurement across the steps of the nickel shell Although this disclosure has described and illustrated certain preferred embodiments of the invention, it is to be understood that the invention is not restricted to those particular embodiments but rather the invention includes all embodiments which are functional or mechanically equivalents of the specific embodiments featured that have been described as illustrated herein.

We claim:

1. A mandrel for use in the manufacture of a nickel shell by the vapor deposition of nickel from gaseous nickel carbonyl, said mandrel comprising a body formed of a composite material which is compatible with the vapor deposition of a removable nickel shell comprising a matrix and a filler and having essentially the same coefficient of thermal expansion as nickel, said coefficient of thermal expansion being between $10 \times 10^{-6}$ mm/mm/° C. to $16 \times 10^{-6}$ mm/mm/° C. and said matrix comprising a ceramic material or an organic polymeric material selected from the group consisting of bismaleimide resins, epoxy resins, phenolic resins, polyester resins, polyamide resins, vinylester resins and mixtures thereof, said composite material also including a surface coating which is acceptable to receive said deposited nickel and so formed as to provide said nickel shell with a well-defined complementary surface, said surface coating being different from the matrix, non-adherent to said nickel shell and being selected from the group consisting of bismaleimide resin, epoxy resin, polyester, polyimide, polyamide, phenolics and vinyl esters.

2. A mandrel according to claim 1 having a removable nickel shell vapor deposited thereon.

3. A mandrel as claimed in claim 1 wherein said matrix comprises a ceramic material.

4. A mandrel as claimed in claim 1 wherein said matrix comprises an organic polymeric material.

5. A mandrel as claimed in claim 1 wherein said filler is selected from the group consisting of metals, metal oxides, ceramics, glass and carbon in the form of powders, fibers and granules.

6. A mandrel as claimed in claim 1 wherein said surface coating comprises 10–20 W/W% 1,4-diglycidyloxybutane, 30–50 W/W% glycidyl benzamine and 30–60 W/W% carbon black fiber in admixture with a hardener.

7. A mandrel as claimed in claim 1 wherein said organic polymeric material is an epoxy resin.

8. A mandrel as claimed in claim 7 wherein said composite material further comprises powdered aluminum oxide

* * * * *